United States Patent
Meyer

(10) Patent No.: US 8,607,175 B1
(45) Date of Patent: *Dec. 10, 2013

(54) IDENTIFYING LOGIC BLOCKS IN A SYNTHESIZED LOGIC DESIGN THAT HAVE SPECIFIED INPUTS

(71) Applicant: International Business Machines Corporation, Armonk, NY (US)

(72) Inventor: Lance R. Meyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/693,127

(22) Filed: Dec. 4, 2012

Related U.S. Application Data

(63) Continuation of application No. 13/644,531, filed on Oct. 4, 2012.

(51) Int. Cl.
  *G06F 9/455* (2006.01)
  *G06F 17/50* (2006.01)
(52) U.S. Cl.
  USPC ............ 716/107; 716/106; 716/111
(58) Field of Classification Search
  USPC .......................................... 716/107
  See application file for complete search history.

(56) References Cited

U.S. PATENT DOCUMENTS

| | | | |
|---|---|---|---|
| 6,134,705 A | 10/2000 | Pedersen et al. | |
| 2008/0046851 A1* | 2/2008 | Miczo | 716/7 |
| 2010/0269077 A1* | 10/2010 | Baumgartner et al. | 716/5 |
| 2012/0005643 A1 | 1/2012 | Schroeder et al. | |
| 2012/0079437 A1 | 3/2012 | Li et al. | |

FOREIGN PATENT DOCUMENTS

| | | |
|---|---|---|
| GB | 1389319 | 4/1975 |
| JP | 63-046819 | 2/1988 |

OTHER PUBLICATIONS

Tekumalla et al., "On Redundant Path Delay Faults in Synchronous Sequential Circuits", IEEE Transactions on Computers, vol. 49, p. 277, Mar. 2000.

* cited by examiner

*Primary Examiner* — Paul Dinh
*Assistant Examiner* — Bryce Aisaka
(74) *Attorney, Agent, or Firm* — Martin & Associates, LLC; Derek P. Martin

(57) ABSTRACT

Logic blocks in a synthesized logic design that have specified inputs are identified by performing a two-pass analysis of the synthesized logic design. A number of levels is specified. A forward linear trace is performed to identify inputs at each level for each logic block, without regard to the specific function of each logic block. A list of potential equivalency points is generated from the forward linear trace. A reverse logical trace is then performed from the potential equivalency points to identify equivalent logic. When no equivalent logic exists, the analysis can specify one or more additional inputs, or one or more missing inputs, to determine whether similar logic exists that could be replicated and modified to achieve the desired function.

6 Claims, 11 Drawing Sheets

IDENTIFYING LOGIC BLOCKS IN A SYNTHESIZED LOGIC DESIGN THAT HAVE SPECIFIED INPUTS

BACKGROUND

1. Technical Field

This disclosure generally relates to designing integrated circuits, and more specifically relates to software tools for designing integrated circuits.

2. Background Art

The proliferation of modern electronics is due in large part to the development of the integrated circuit. Integrated circuits allow many different circuit elements to be implemented on a single chip. As technology advances, the number of circuit elements on a chip of a given size increases, enhancing the performance and reducing the cost of integrated circuits.

The design of integrated circuits is typically performed in three stages. The first stage is logic design, wherein the desired operation of the integrated circuit is defined. The second stage is logic synthesis, wherein the desired operation is translated into the required circuit elements for a given technology. The third stage is physical design, which assigns the placement of these elements and routing which creates the wire interconnect of these elements on the integrated circuit. Placement defines the location of the circuit elements on the integrated circuit. Routing defines interconnections between circuit elements.

The design cycle for an integrated circuit typically requires many engineering changes. An engineering change to an integrated circuit is typically created by analyzing an update to a high-level logic design in a high-level design language and making the equivalent logical change to a synthesized version of that design. For simple logic changes this is a fairly easy process to follow. However, when the high-level design changes are complex or buried deep inside of shared logic it is not always easy to locate the equivalent function in the synthesized logic design. This is primarily due to the fact that synthesis combines common logic and creates a new set of signal names that cannot be traced back to any source in the high-level design. Considerable time and effort can be devoted to manually searching through the synthesized output to locate the logic blocks at which to implement the engineering change.

BRIEF SUMMARY

Logic blocks in a synthesized logic design that have specified inputs are identified by performing a two-pass analysis of the synthesized logic design. A number of levels is specified. A forward linear trace is performed to identify inputs at each level for each logic block, without regard to the specific function of each logic block. A list of potential equivalency points is generated from the forward linear trace. A reverse logical trace is then performed from the potential equivalency points to identify equivalent logic. When no equivalent logic exists, the analysis can specify one or more additional inputs, or one or more missing inputs, to determine whether similar logic exists that could be replicated and modified to achieve the desired function.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

DETAILED DESCRIPTION

The disclosure and claims are directed to identifying logic blocks in a synthesized logic design that have specified inputs by performing a two-pass analysis of the synthesized logic design. A number of levels is specified. A forward linear trace is performed to identify inputs at each level for each logic block, without regard to the specific function of each logic block. A list of potential equivalency points is generated from the forward linear trace. A reverse logical trace is then performed from the potential equivalency points to identify equivalent logic. When no equivalent logic exists, the analysis can specify one or more additional inputs, or one or more missing inputs, to determine whether similar logic exists that could be replicated and modified to achieve the desired function.

Figure 1:
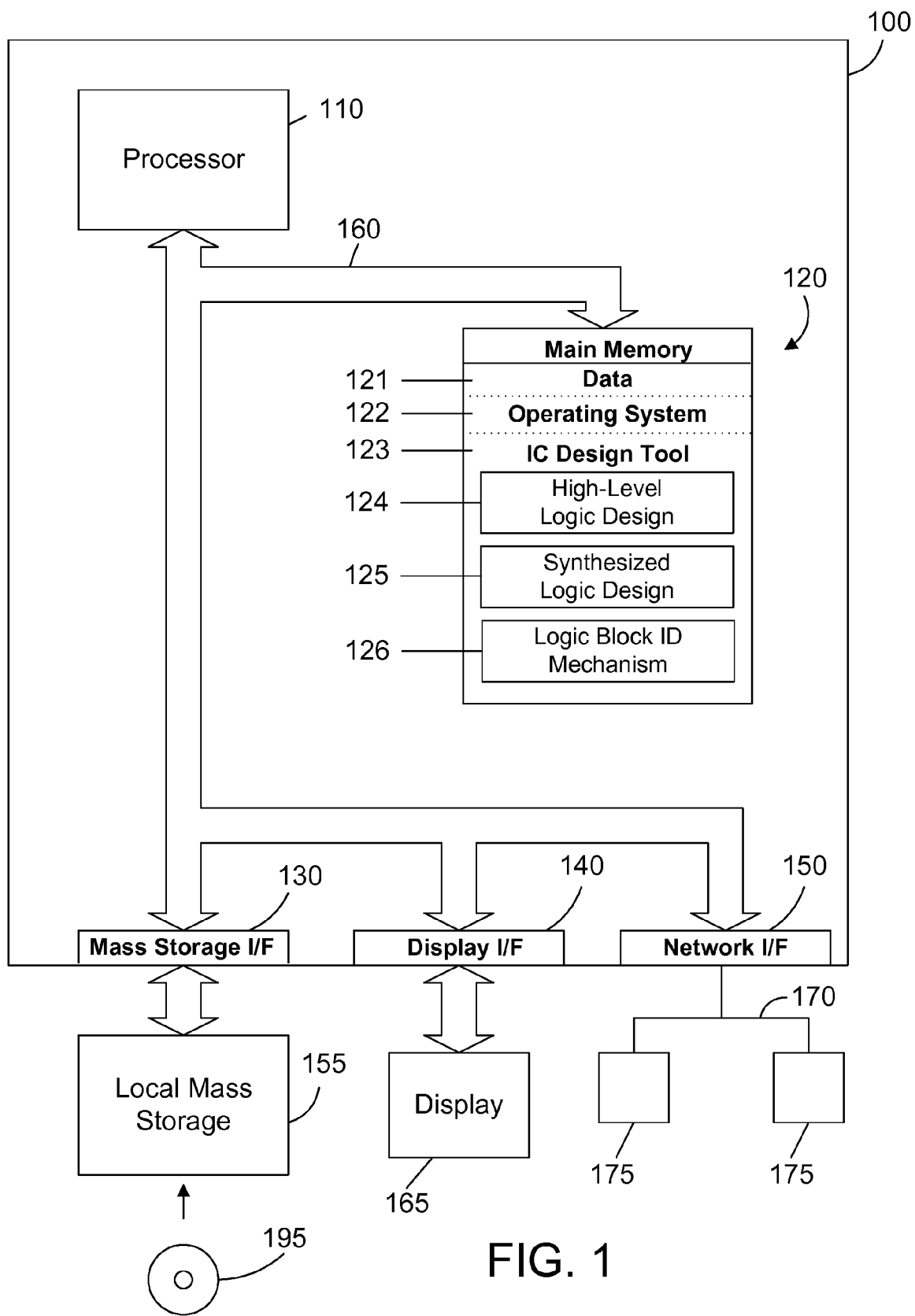
FIG. 1 is a block diagram of an apparatus that has an integrated circuit design tool that includes a logic block identification mechanism.

Referring to FIG. 1, a computer system 100 is one suitable implementation of a server computer system that includes an integrated circuit design tool. Server computer system 100 is an IBM zEnterprise System computer system. However, those skilled in the art will appreciate that the disclosure herein applies equally to any computer system, regardless of whether the computer system is a complicated multi-user computing apparatus, a single user workstation, or an embedded control system. As shown in FIG. 1, computer system 100 comprises one or more processors 110, a main memory 120, a mass storage interface 130, a display interface 140, and a network interface 150. These system components are interconnected through the use of a system bus 160. Mass storage interface 130 is used to connect mass storage devices, such as local mass storage device 155, to computer system 100. One specific type of local mass storage device 155 is a readable and writable CD-RW drive, which may store data to and read data from a CD-RW 195.

Main memory 120 preferably contains data 121, an operating system 122, and an integrated circuit (IC) design tool 123. Data 121 represents any data that serves as input to or output from any program in computer system 100. Operating system 122 is a multitasking operating system. IC design tool 123 includes a high-level logic design 124, a synthesized logic design 125, and a logic block identification mechanism 126. The high-level logic design 124 is a logic design in a high-level hardware description language. The synthesized logic design 125 is the output that results from processing the high-level logic design 124. The logic block identification mechanism 126 analyzes the synthesized logic design 125, and identifies one or more logic blocks in the synthesized logic design 125 that have specified inputs. The details of this analysis are provided below.

Computer system 100 utilizes well known virtual addressing mechanisms that allow the programs of computer system 100 to behave as if they only have access to a large, contiguous address space instead of access to multiple, smaller storage entities such as main memory 120 and local mass storage device 155. Therefore, while data 121, operating system 122 and IC design tool 123 are shown to reside in main memory 120, those skilled in the art will recognize that these items are not necessarily all completely contained in main memory 120 at the same time. It should also be noted that the term "memory" is used herein generically to refer to the entire virtual memory of computer system 100, and may include the virtual memory of other computer systems coupled to computer system 100.

Processor 110 may be constructed from one or more microprocessors and/or integrated circuits. Processor 110 executes program instructions stored in main memory 120. Main memory 120 stores programs and data that processor 110 may access. When computer system 100 starts up, processor 110 initially executes the program instructions that make up operating system 122. Processor 110 also executes the IC design tool 123.

Although computer system 100 is shown to contain only a single processor and a single system bus, those skilled in the art will appreciate that an integrated circuit design tool may be practiced using a computer system that has multiple processors and/or multiple buses. In addition, the interfaces that are used preferably each include separate, fully programmed microprocessors that are used to off-load compute-intensive processing from processor 110. However, those skilled in the art will appreciate that these functions may be performed using I/O adapters as well.

Display interface 140 is used to directly connect one or more displays 165 to computer system 100. These displays 165, which may be non-intelligent (i.e., dumb) terminals or fully programmable workstations, are used to provide system administrators and users the ability to communicate with computer system 100. Note, however, that while display interface 140 is provided to support communication with one or more displays 165, computer system 100 does not necessarily require a display 165, because all needed interaction with users and other processes may occur via network interface 150.

Network interface 150 is used to connect computer system 100 to other computer systems or workstations 175 via network 170. Network interface 150 broadly represents any suitable way to interconnect electronic devices, regardless of whether the network 170 comprises present-day analog and/or digital techniques or via some networking mechanism of the future. Network interface 150 preferably includes a combination of hardware and software that allow communicating on the network 170. Software in the network interface 150 preferably includes a communication manager that manages communication with other computer systems 175 via network 170 using a suitable network protocol. Many different network protocols can be used to implement a network. These protocols are specialized computer programs that allow computers to communicate across a network. TCP/IP (Transmission Control Protocol/Internet Protocol) is an example of a suitable network protocol that may be used by the communication manager within the network interface 150.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 2:
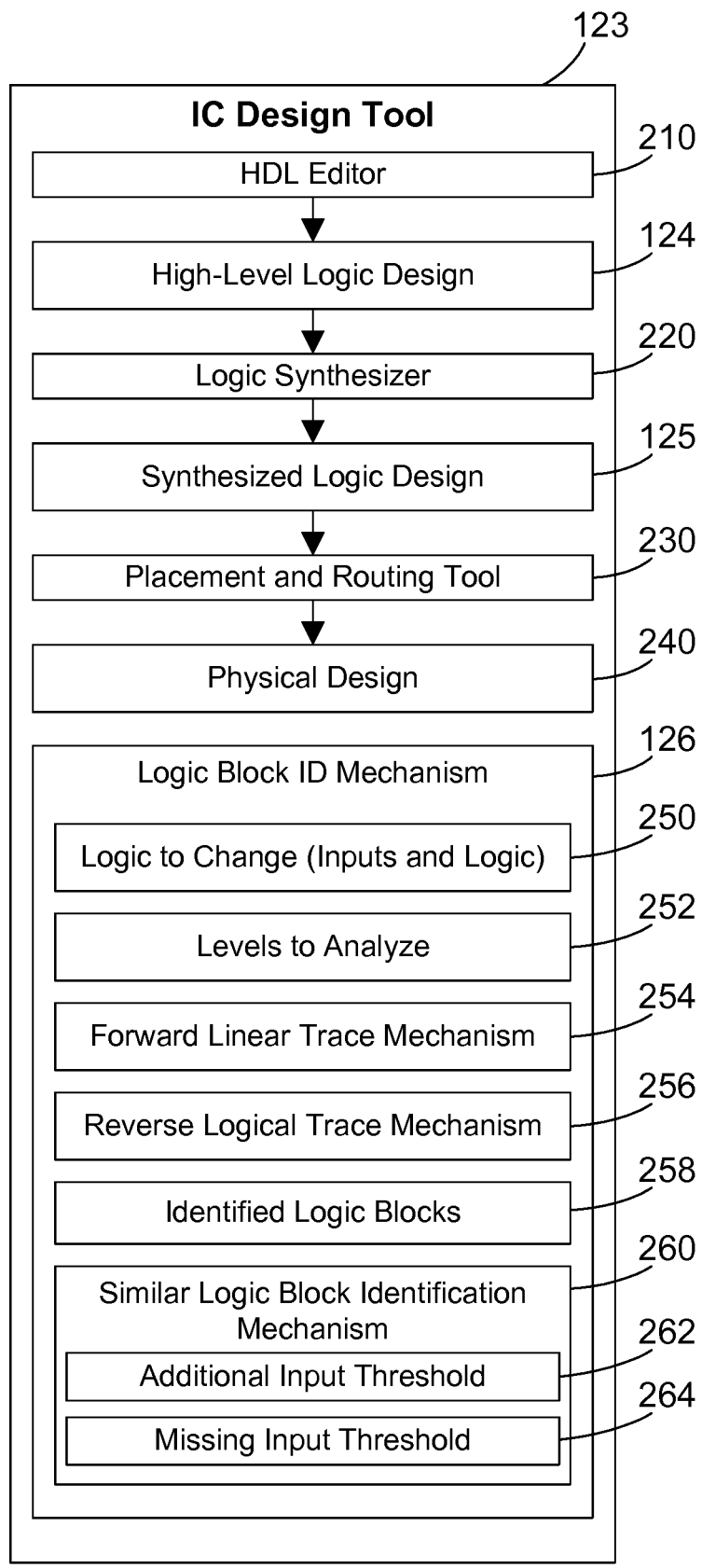
FIG. 2 is a block diagram showing details of the integrated circuit design tool shown in FIG. 1.

Referring to FIG. 2, additional details of the integrated circuit design tool 123 in FIG. 1 are shown. The IC design tool 123 includes a Hardware Description Language (HDL) editor 210 that is used to generate the high-level logic design 124. The high-level logic design 124 is input into a logic synthesizer 220, which generates the synthesized logic design 125. A placement and routing tool 230 then uses the synthesized logic design to generate the physical design 240 of the integrated circuit, including all needed logic blocks and interconnections. Items 210, 124, 220, 125, 230 and 240 are well-known in the art.

The logic block identification mechanism 126 includes logic to change 250, levels to analyze 252, a forward linear trace mechanism 254, a reverse logical trace mechanism 256, identified logic blocks 258, and a similar logic block identification mechanism 260. The logic to change 250 includes both inputs and logic in the synthesized logic design 125 that represent logic that needs to be changed in the synthesized logic design 125. The levels to analyze 252 specifies how many levels deep from the logic to change 250 the logic block identification mechanism 126 will analyze. The levels to analyze 252 could depend on the complexity of the design being analyzed. There is an exponential increase in analysis time for each level analyzed. By specifying the levels to analyze 252, the logic block identification mechanism 126 analyzes only the most relevant blocks without spending substantial time analyzing blocks that are significantly less relevant. The forward linear trace mechanism 254 performs a forward trace in the synthesized logic design 125 from the point of the specified inputs in the logic to change 250 to a number of levels specified in the levels to analyze 252, analyzing inputs to logic blocks without regard to the specific logic in each logic block. The forward linear trace mechanism 254 produces a list of potential equivalency points in the synthesized logic design 125 based solely on the inputs to each logic block. The reverse logical trace mechanism 256 begins at the potential equivalency points in the synthesized logic design 125 produced by the forward linear trace mechanism 254, and performs logical analysis in the reverse direction to determine whether there are any cones of logic that have equivalent logic to the logic to change 250. When there are one or more cones of logic in the synthesized logic design 125 that have equivalent logic to the logic to analyze 250, these cone(s) of logic are the identified logic blocs 258 identified by the logic block identification mechanism 126. When there are no cones of logic in the synthesized logic design 125 that have equivalent logic, the similar block identification mechanism 260 will determine whether there is similar logic that could be replicated and modified to generate the needed logic. The similar logic block identification mechanism 260 may include an additional input threshold 262 and a missing input threshold 264. For example, when the additional input threshold is two, the similar logic block identification mechanism 260 will look for cones of logic in the synthesized logic design 125 that have one or two additional inputs, which are inputs other than the inputs specified in the logic to change 250. When the missing input threshold 264 is one, the similar logic block identification mechanism 260 will look for cones of logic in the synthesized logic design 125 that have one missing input. In this manner the logic block identification mechanism 126 automatically searches the synthesized logic design 125 for the logic to change 250, greatly simplifying the process of identifying the logic to change in the synthesized logic design 125 when compared to the known manual and very time-consuming process of going through the synthesized logic design 125 and trying to correlate different signal names in the synthesized logic design 125 to signal names in the high-level logic design 124.

Figure 3:
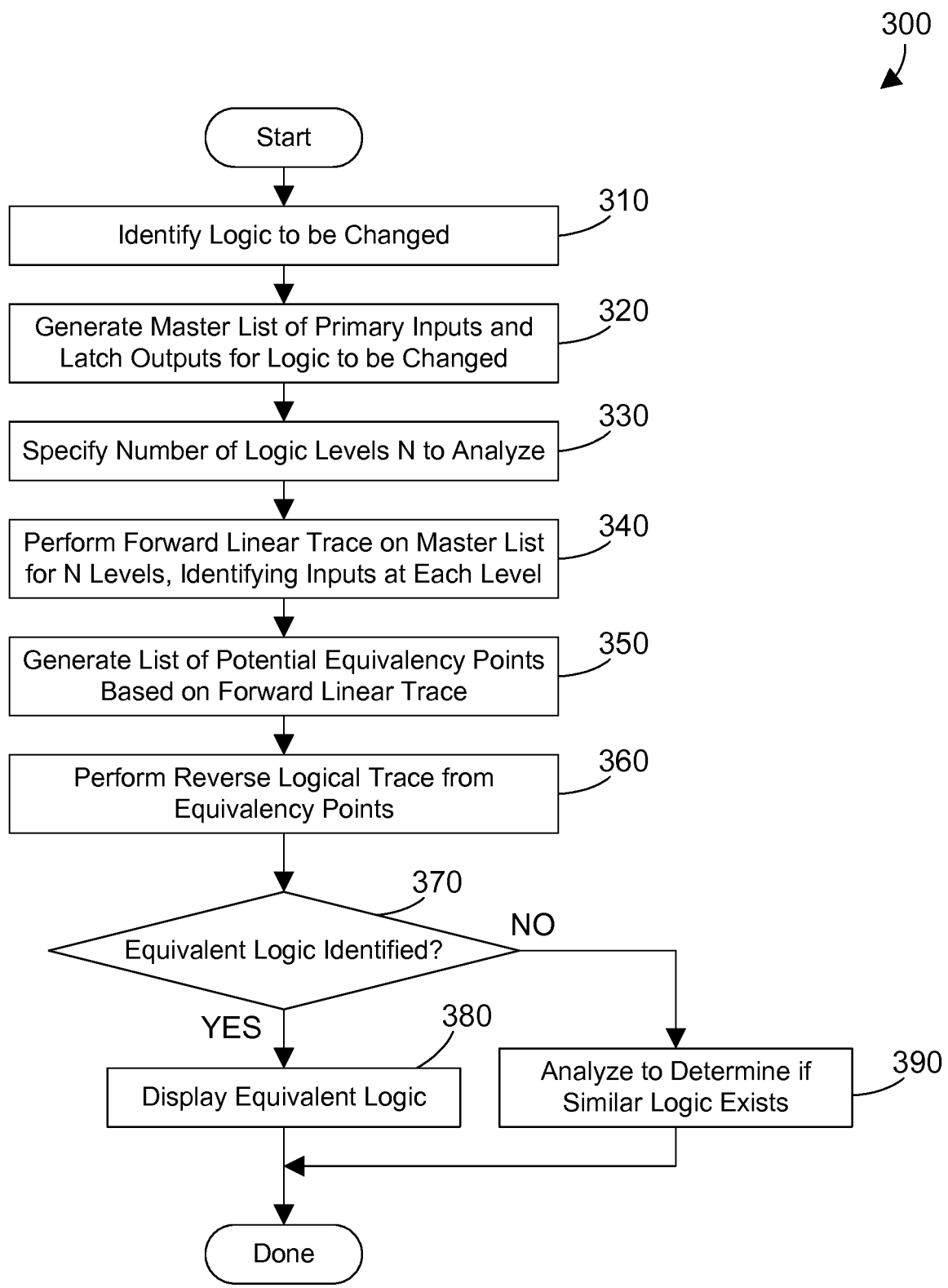
FIG. 3 is a flow diagram of a method for identifying logic blocks in a synthesized logic design that have specified inputs.

Referring to FIG. 3, a method 300 is preferably performed by the logic block identification mechanism 126 shown in FIGS. 1 and 2. The logic to be changed in the synthesized logic design is identified (step 310). The logic to be changed is specified in terms of inputs and logical operations on those inputs. A master list of primary inputs and latch outputs for the logic to be changed is then generated (step 320). The number N of logic levels to analyze is then specified (step 330). A forward linear trace is then performed on the master list for N levels, identifying inputs at each level, without regard to the logic performed by each logic block (step 340). A list of potential equivalency points is then generated based on the results of the forward linear trace (step 350). A reverse logical trace is then performed from each of the potential equivalency points (step 360). The reverse logical trace in step 360 can identify one or more cone(s) of logic that are potential equivalent logic. When equivalent logic is identified (step 370=YES), the equivalent logic is then displayed (step 380). When no equivalent logic is identified (step 370=NO), the results of the forward linear trace and reverse logical trace are analyzed to determine if similar logic exists (step 390). Method 300 is then done.

Once the logic is changed in the synthesized logic design 125, one skilled in the art will recognize that corresponding changes will be made in the high-level logic design 124. Then the IC design tool can verify the boolean equivalency between the high-level logic design and the synthesized logic design after an engineering change has been made.

Figure 4:
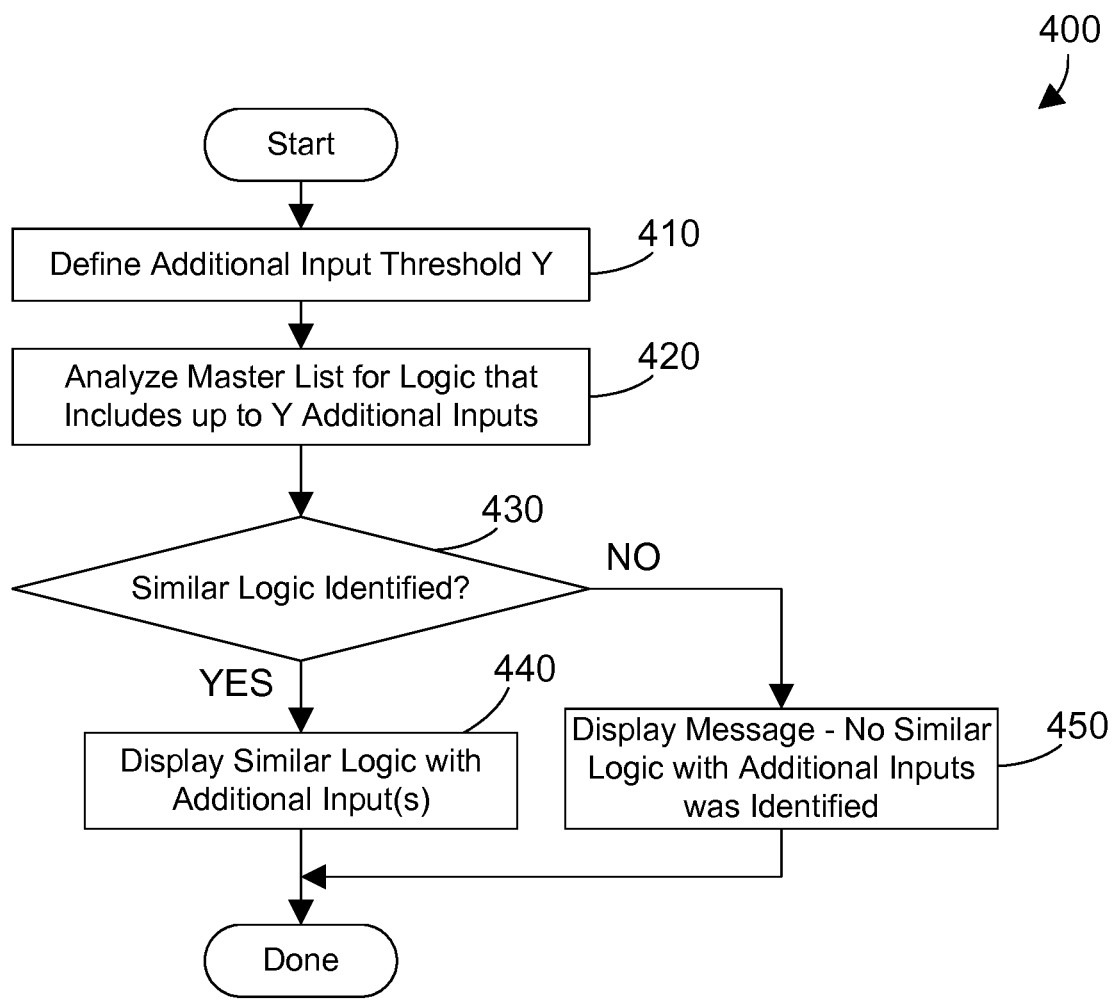
FIG. 4 is a flow diagram of a method for identifying similar logic that has one or more additional inputs.

There are different ways to determine if similar logic exists in step 390 in FIG. 3. For example, method 400 shown in FIG. 4 is one suitable implementation for step 390 in FIG. 3. Method 400 looks for logic that may have one or more additional inputs. If such similar logic exists, it could be replicated and then modified to generate the needed change to the synthesized logic design. An additional input threshold Y is defined (step 410). One suitable implementation for the additional input threshold is an integer that specifies the maximum number of allowed additional inputs. Thus, if the additional input threshold is set to two, logic with one or two additional inputs could be deemed similar. The master list is then analyzed for logic that includes up to Y additional inputs (step 420). When similar logic is identified (step 430=YES), the similar logic with the additional input(s) is displayed (step 440). When no similar logic is identified (step 430=NO), a message is displayed indicating no similar logic with additional inputs was identified (step 450). Method 400 is then done.

Figure 5:
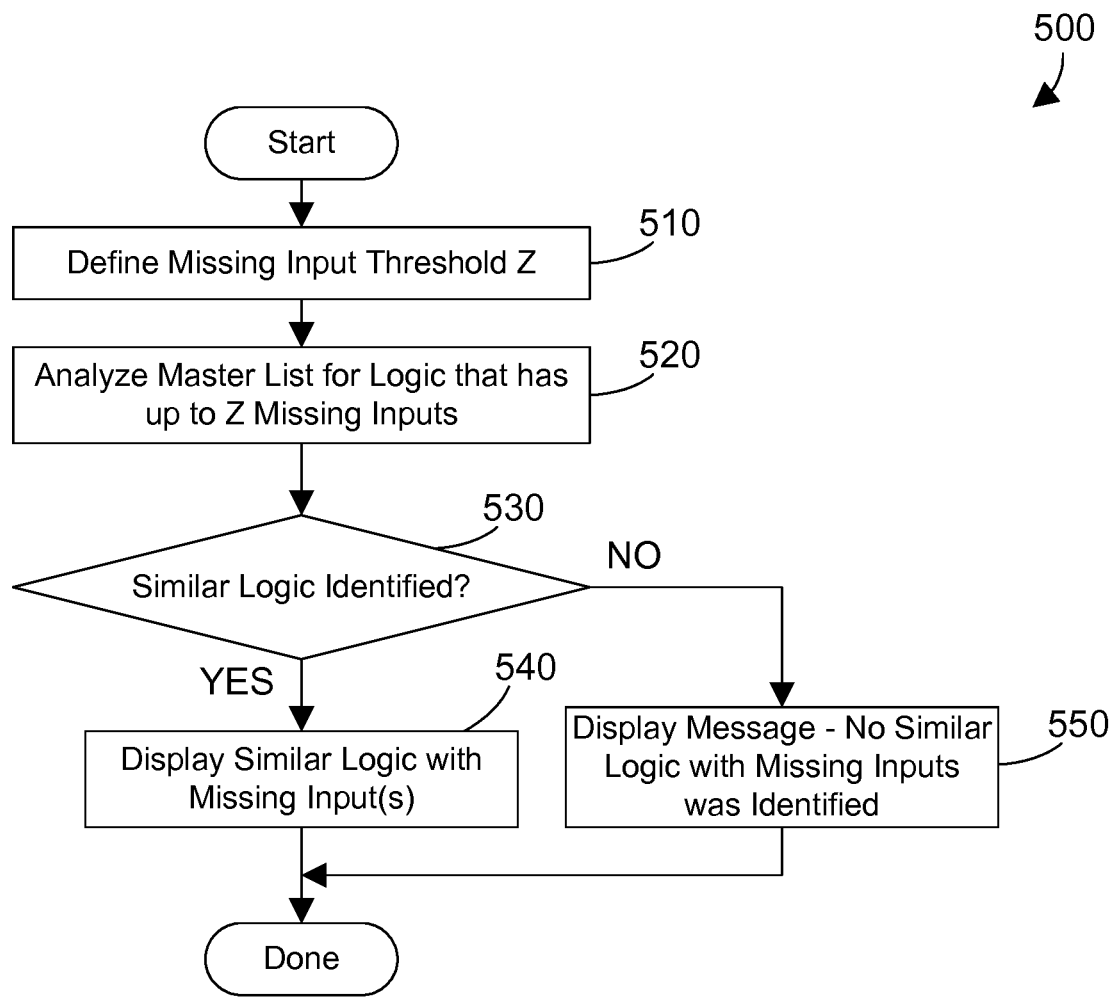
FIG. 5 is a flow diagram of a method for identifying similar logic that has one or more missing inputs.

Method 500 shown in FIG. 5 is another suitable implementation for step 390 in FIG. 3. Method 500 looks for logic that may have one or more missing inputs. If such similar logic exists, it could be replicated and then modified to generate the needed change to the synthesized logic design. A missing input threshold Z is defined (step 510). One suitable implementation for the missing input threshold is an integer that specifies the maximum number of allowed missing inputs. Thus, if the missing input threshold is set to one, logic with one missing input could be deemed similar. The master list is then analyzed for logic that includes up to Z missing inputs (step 520). When similar logic is identified (step 530=YES), the similar logic with the missing input(s) is displayed (step 540). When no similar logic is identified (step 530=NO), a message is displayed indicating no similar logic with missing inputs was identified (step 550). Method 500 is then done.

Figure 6:
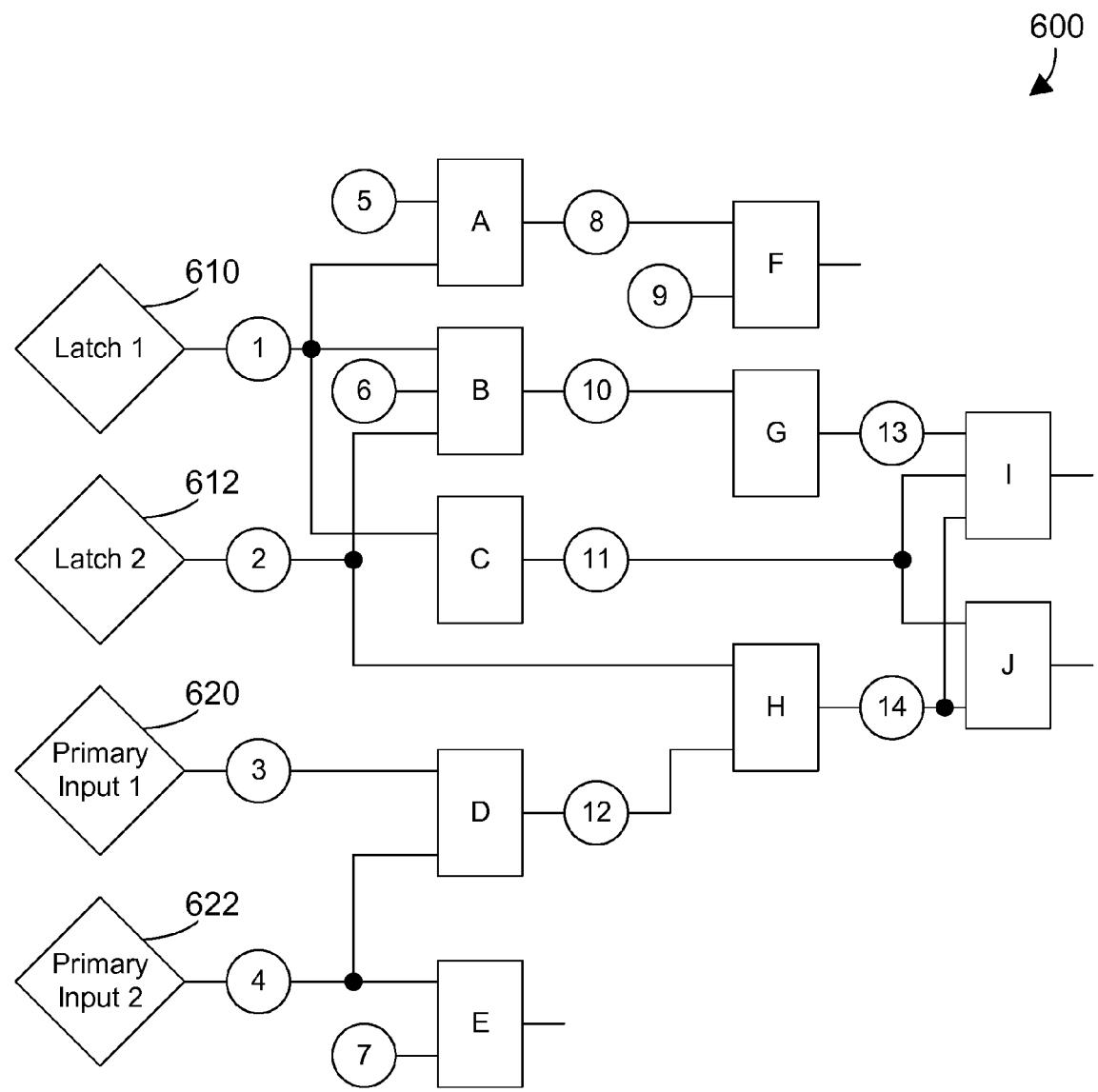
FIG. 6 is a block diagram of one portion of a sample synthesized logic design.
Figure 7:
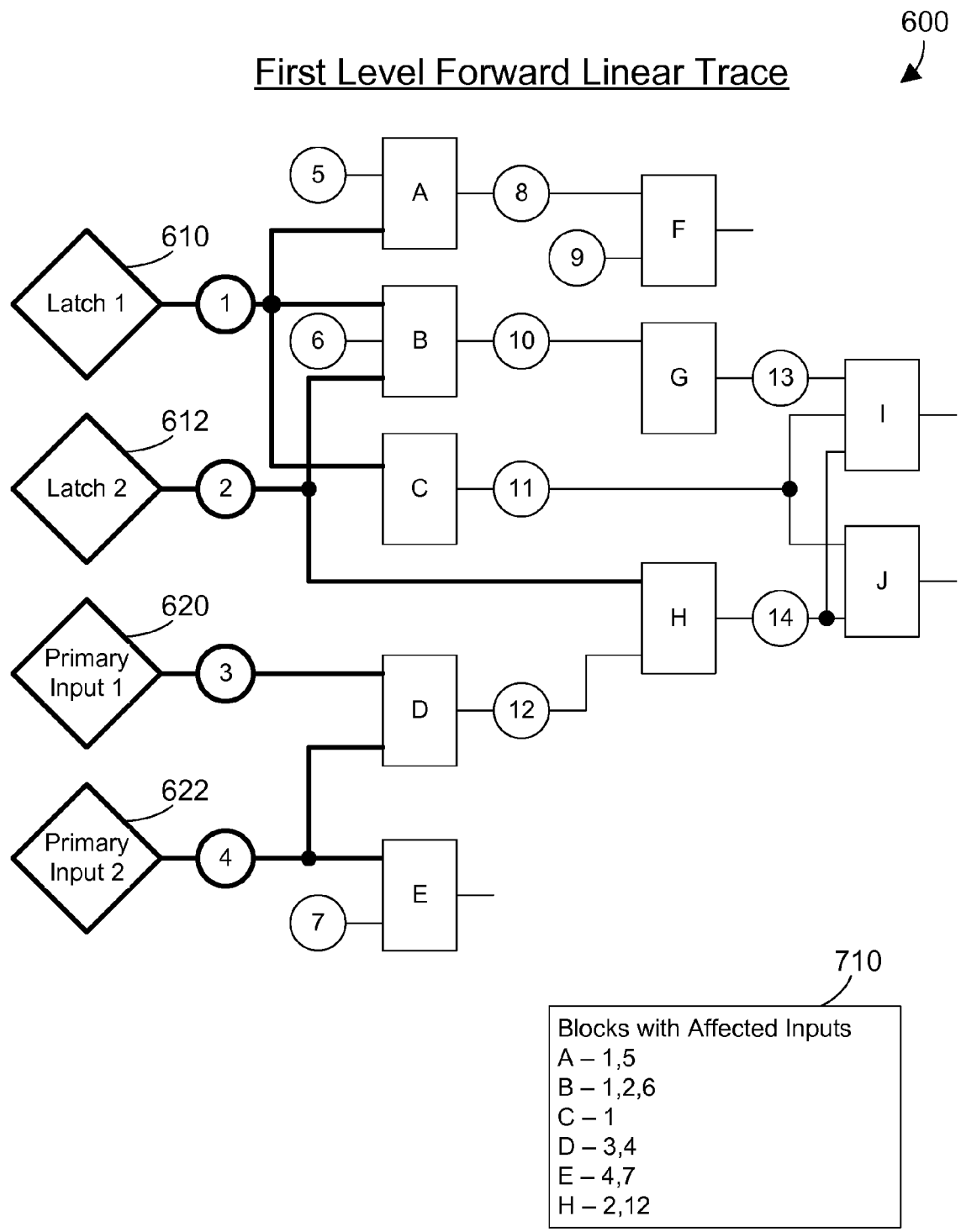
FIG. 7 is a block diagram showing the first level forward linear trace for the synthesized logic design in FIG. 6.
Figure 8:
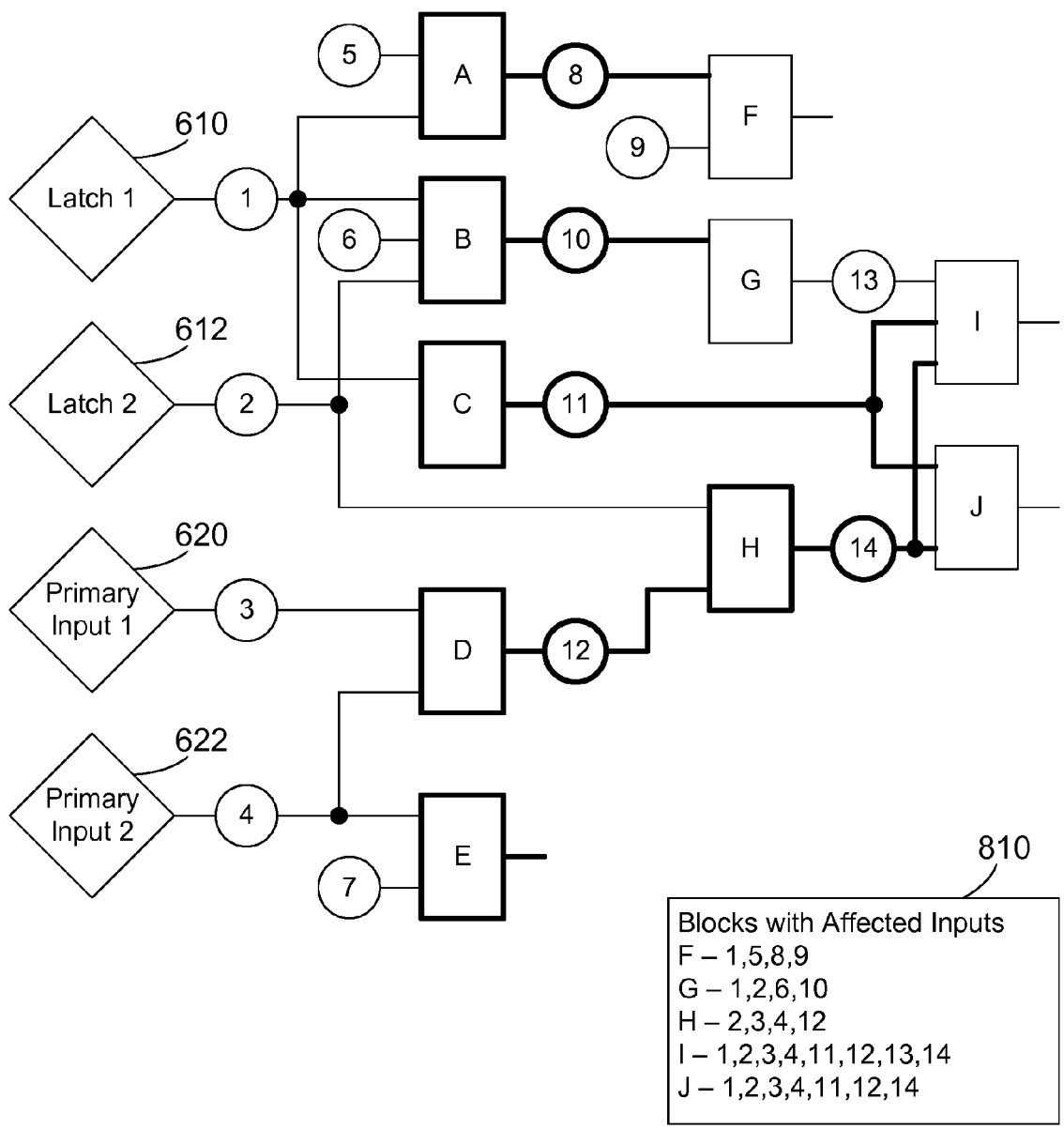
FIG. 8 is a block diagram showing the second level forward linear trace for the synthesized logic design in FIG. 6.
Figure 9:
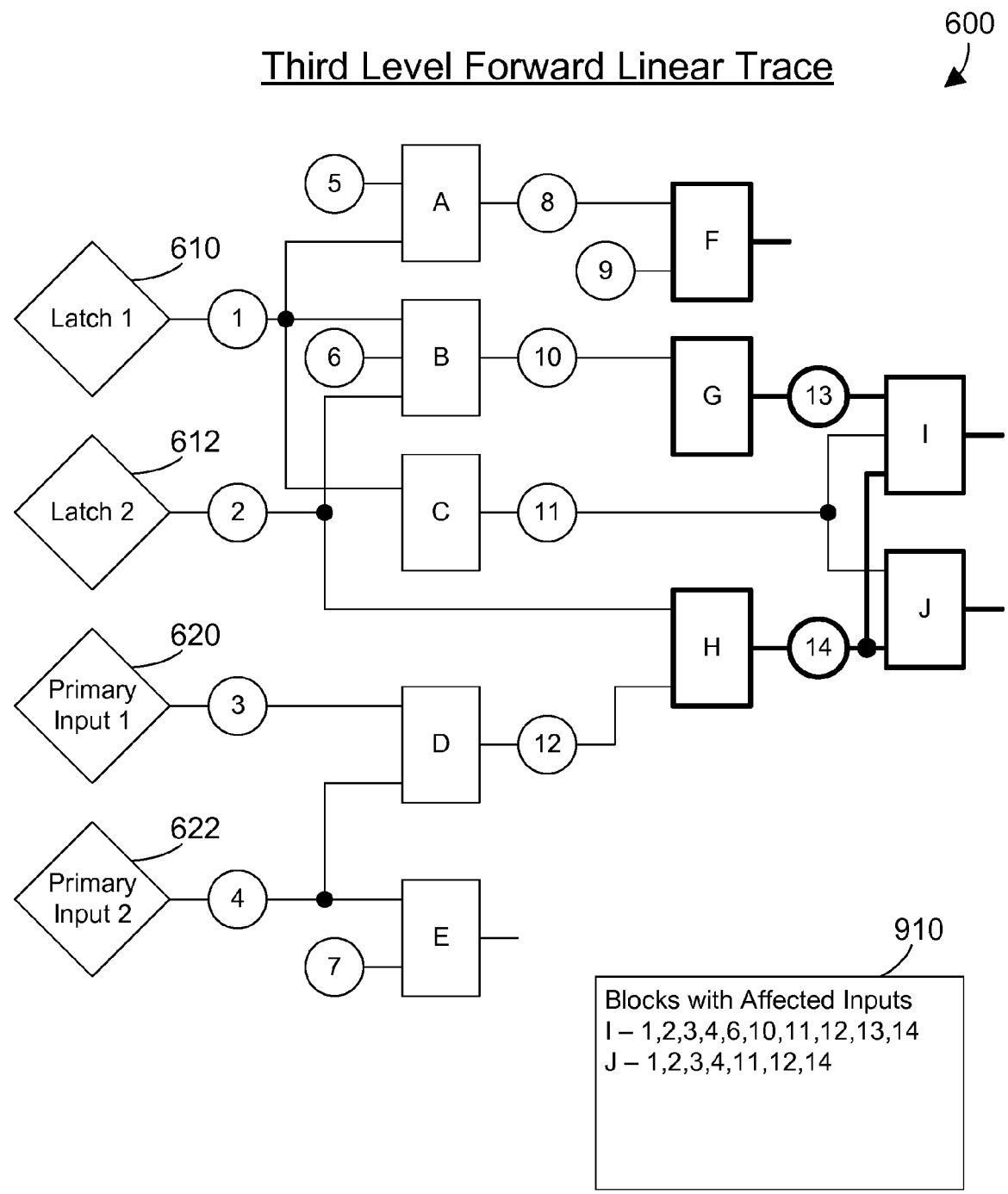
FIG. 9 is a block diagram showing the third level forward linear trace for the synthesized logic design in FIG. 6.

An example is now presented in FIGS. 6-11 to illustrate the concepts discussed herein. Note the example is extremely simplified for the purpose of illustration. Outputs from the logic blocks A-J that are not shown connected are assumed to drive logic outside the scope of this example. Referring to FIG. 6, a sample circuit 600 is shown which is a part of the synthesized logic design 125 shown in FIGS. 1 and 2. The two latch inputs 610 and 612 represent latch outputs from elsewhere in the synthesized logic design, and the two primary inputs 620 and 622 represent primary inputs to the synthesized logic design. The combination of latch inputs 610, 612 and primary inputs 620, 622 are the specified inputs for the logic to be changed. The logic blocks in circuit 600 are represented by the boxes labeled A through J, and the signals, or inputs, are labeled numerically from 1 to 14. We assume the circuit 600 represents the logic to be changed, and is a graphical representation of the logic driven by the master list generated in step 320 in FIG. 3. This example is based on specifying three levels to analyze, which means N=3 in step 330 in FIG. 3. In step 340 in FIG. 3, a forward linear trace is performed for three levels, identifying inputs at each level, ignoring the logic performed by each logic block. The forward linear trace is shown in FIGS. 7-9, one for each level. Referring to FIG. 7, the first level forward linear trace considers the bolded portions that include the latch inputs 610, 612 and the primary inputs 620, 622. These are labeled as inputs 1 through 4 as shown in circuit 600. Note the forward linear trace ignores the specific logic in logic blocks A-J, and analyzes only the inputs to the logic blocks. The result of performing the first level forward linear trace is shown at 710 in FIG. 7, with each logic block with affected inputs listed, along with the inputs for that block that were affected. Thus, block A has input 1 that comes from one of the specified inputs, but also has another input 5 that does not. Block A is thus affected by one of the specified inputs, and is therefore an affected block. All inputs to an affected block are affected inputs. As a result, block A has affected inputs 1 and 5 as shown at 710 in FIG. 7. Block B has inputs 1 and 2 that come from the specified inputs, but also has another input 6 that does not. As a result, block B has affected inputs 1, 5 and 6 as shown at 710. Similar analysis could be performed for blocks C, D, E and H, which results in block C having affected input 1, block D having affected inputs 3 and 4, block E having affected inputs 4 and 7, and block H having affected inputs 2 and 12, as shown at 710 in FIG. 7.

The second level of the forward linear trace is shown by the bolded portions in FIG. 8. Blocks that have affected inputs are listed at 810, along with the affected inputs. Thus, block F has inputs 8 and 9, but input 8 is from block A, which has affected inputs 1 and 5 shown at 710 in FIG. 8. As a result, block F has affected inputs 1, 5, 8, 9 as shown at 810 in FIG. 8. A similar analysis for each block in the second level forward trace shows block G has affected inputs 1, 2, 6, 10; block H has affected inputs 2, 3, 4, 12; block I has affected inputs 1, 2, 3, 4, 11, 12, 13, 14; and block J has affected inputs 1, 2, 3, 4, 11, 12, 14. Because the specified inputs correspond to 1,2,3,4, both I and J are potential equivalency points based on the second level forward linear trace.

The third level of the forward linear trace is shown by the bolded portions in FIG. 9, with the results shown at 910. The result of the third level of the forward linear trace is: block I has affected inputs 1, 2, 3, 4, 6, 10, 11, 12, 13, 14, while block J has affected inputs 1, 2, 3, 4, 11, 12, 14, as shown at 910 in FIG. 9. This completes the forward linear trace for the specified inputs for the specified three levels. At this point, the blocks with affected inputs I and J listed at 910 in FIG. 9 are compared to the specified inputs 1, 2, 3, 4 that represent the logic to be changed. We see that both blocks I and J include inputs 1, 2, 3 and 4, so both blocks I and J are potential equivalency points that would be identified in step 350 in FIG. 3 for the specific example in FIGS. 6-11.

Figure 10:
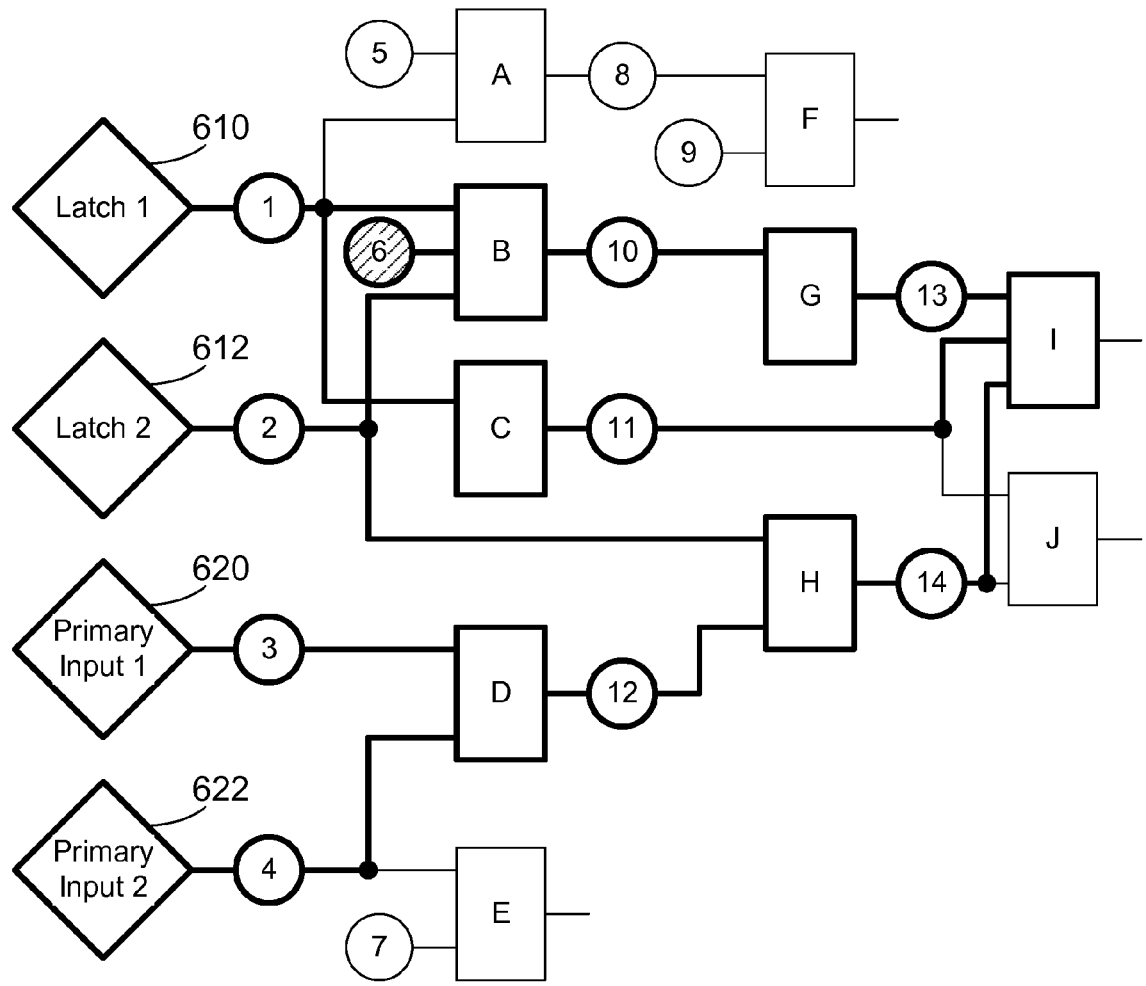
FIG. 10 is a block diagram showing the logical reverse trace on Block I.
Figure 11:
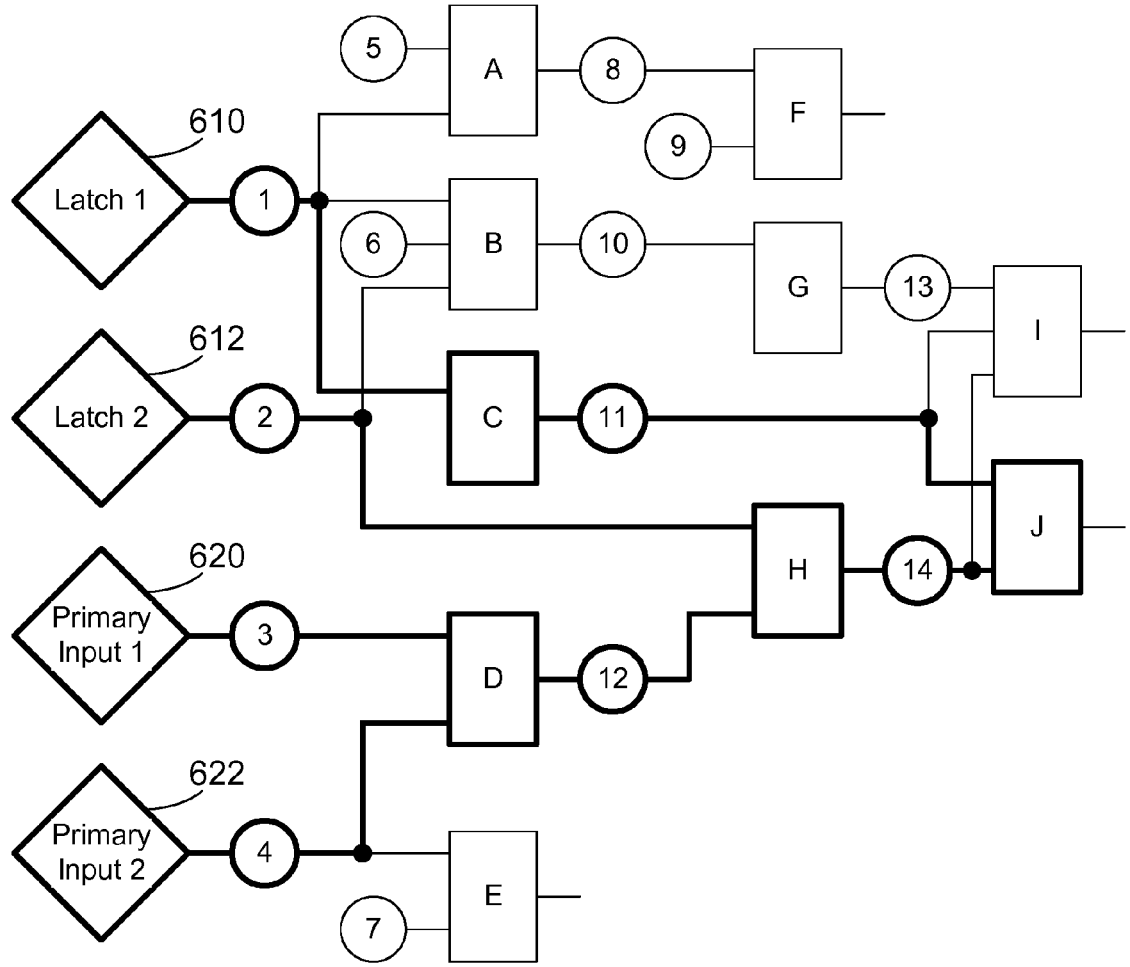
FIG. 11 is a block diagram showing the logical reverse trace on Block J.

At this point, a reverse logical trace is performed for blocks I and J in step 360 in FIG. 3. The reverse logical trace for block I is shown in FIG. 10, while the reverse logical trace for block J is shown in FIG. 11. Referring to FIG. 10, in performing the reverse logical trace on block I, it is discovered that the cone of logic shown in bold in FIG. 10 includes in additional input 6 on block B that is not part of the original specified inputs 1, 2, 3, 4. As a result, the cone of logic from block I shown in FIG. 10 is not equivalent to the specified inputs 1, 2, 3, 4 in the circuit to be changed. Next, a reverse logical trace is performed for block J, which is shown by the bold portions in FIG. 11. All of the logic driving block J can be traced back to the specified inputs 1, 2, 3, 4, so block J is a good candidate to be equivalent logic, so step 370=YES in FIG. 3. The cone of logic from block J shown in FIG. 11 is then displayed in step 380, which allows the user to compare the functionality of this cone to the logic in the high-level design language.

The logic block identification mechanism and corresponding method provide an automated way to identify logic blocks in a synthesized logic design that correspond to specified inputs. No longer must an integrated circuit designer manually search through the synthesized logic design for affected logic. This powerful tool helps the designer more quickly identify logic blocks in the synthesized logic design that may need to be changed in an engineering change order.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The disclosure and claims are directed to identifying logic blocks in a synthesized logic design that have specified inputs by performing a two-pass analysis of the synthesized logic design. A number of levels is specified. A forward linear trace is performed to identify inputs at each level for each logic block, without regard to the specific function of each logic block. A list of potential equivalency points is generated from the forward linear trace. A reverse logical trace is then performed from the potential equivalency points to identify equivalent logic. When no equivalent logic exists, the analysis can specify one or more additional inputs, or one or more missing inputs, to determine whether similar logic exists that could be replicated and modified to achieve the desired function.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. A computer-implemented method executed by at least one processor for identifying at least one logic block in a synthesized logic design that has specified inputs, wherein the synthesized logic design includes a plurality of logic blocks and a plurality of inputs, the method comprising the steps of: providing the at least one processor that performs the steps of:

specifying the specified inputs;

specifying a number of levels in the synthesized logic design to analyze;

performing a forward linear trace to identify inputs at each level for each logic block without regard to logical function of each logic block;

identifying from the identified inputs at least one potential equivalency point from the forward linear trace; and following completion of the forward linear trace for the specified number of levels, performing a reverse logical trace from the at least one potential equivalency point to identify equivalent logic, wherein the equivalent logic comprises the identified at least one logic block in the synthesized logic design that has the specified inputs.

2. The method of claim 1 further comprising the steps of: when no equivalent logic exists, determining whether similar logic exists that could be replicated and modified to achieve a desired function.

3. The method of claim 2 wherein the similar logic has at least one additional input.

4. The method of claim 2 wherein the similar logic has at least one missing input.

5. The method of claim 1 wherein during the forward linear trace, generating a list of affected inputs for each logic block that has at least one affected input determined by at least one of the specified inputs.

6. The method of claim 5 further comprising the step of comparing the list of affected inputs to the specified inputs, and when the list of affected inputs for a selected logic block includes the specified inputs, the selected logic block is one of the at least one potential equivalency point.

* * * * *